(12) United States Patent
Cheng et al.

(10) Patent No.: US 9,520,397 B2
(45) Date of Patent: Dec. 13, 2016

(54) ABRUPT SOURCE/DRAIN JUNCTION FORMATION USING A DIFFUSION FACILITATION LAYER

(71) Applicant: INTERNATIONAL BUSINESS MACHINES CORPORATION, Armonk, NY (US)

(72) Inventors: Kangguo Cheng, Schenectady, NY (US); Bruce B. Doris, Brewster, NY (US); Pouya Hashemi, White Plains, NY (US); Ali Khakifirooz, Mountain View, CA (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/697,024

(22) Filed: Apr. 27, 2015

(65) Prior Publication Data
US 2015/0270343 A1    Sep. 24, 2015

Related U.S. Application Data

(62) Division of application No. 14/221,482, filed on Mar. 21, 2014, now Pat. No. 9,202,812.

(51) Int. Cl.
*H01L 27/092* (2006.01)
*H01L 29/165* (2006.01)
(Continued)

(52) U.S. Cl.
CPC ....... *H01L 27/0922* (2013.01); *H01L 21/2254* (2013.01); *H01L 21/324* (2013.01); *H01L 21/823814* (2013.01); *H01L 27/092* (2013.01); *H01L 29/0847* (2013.01); *H01L 29/161* (2013.01); *H01L 29/165* (2013.01); *H01L 29/167* (2013.01); *H01L 29/41783* (2013.01);
(Continued)

(58) Field of Classification Search
CPC .......................... H01L 29/0847; H01L 29/165
USPC .......................................................... 257/192
See application file for complete search history.

(56) References Cited

U.S. PATENT DOCUMENTS 5,856,225 A    1/1999  Lee
6,180,978 B1   1/2001  Chatterjee et al.
(Continued)

OTHER PUBLICATIONS

H.-H. Vuong et al., "Use of transient enhanced diffusion to tailor boron out-diffusion," IEEE Transactions on Electron Devices, vol. 47, No. 7, 2000, 1401-1405.
(Continued)

*Primary Examiner* — Tran Tran
(74) *Attorney, Agent, or Firm* — Cantor Colburn LLP; Vazken Alexanian

(57) ABSTRACT

A method of forming a field effect transistor (FET) device includes forming a diffusion facilitation layer on top of a semiconductor substrate; forming a doped, raised source/drain (RSD) layer on the diffusion facilitation layer; removing a portion of the diffusion facilitation layer, corresponding to a region directly above a channel region of the FET device; and performing an anneal so as to define abrupt source and drain junctions in the semiconductor substrate, wherein dopant atoms from the doped RSD layer diffuse within the diffusion facilitation layer at a faster rate than with respect to the semiconductor substrate.

8 Claims, 11 Drawing Sheets

(51) Int. Cl.
  *H01L 29/167* (2006.01)
  *H01L 29/161* (2006.01)
  *H01L 29/08* (2006.01)
  *H01L 29/417* (2006.01)
  *H01L 21/324* (2006.01)
  *H01L 21/225* (2006.01)
  *H01L 21/8238* (2006.01)
  *H01L 29/78* (2006.01)
  *H01L 29/66* (2006.01)
  *H01L 29/423* (2006.01)

(52) U.S. Cl.
  CPC ......... *H01L 29/78* (2013.01); *H01L 29/42376* (2013.01); *H01L 29/66545* (2013.01)

(56) References Cited

U.S. PATENT DOCUMENTS

| | | | |
|---|---|---|---|
| 6,376,293 | B1 | 4/2002 | Chapman |
| 6,403,433 | B1 | 6/2002 | Yu et al. |
| 7,456,068 | B2 | 11/2008 | Kavalieros et al. |
| 7,682,916 | B2 | 3/2010 | Murthy et al. |
| 8,084,309 | B2 | 12/2011 | Cheng et al. |
| 8,304,301 | B2 | 11/2012 | Cheng et al. |
| 8,435,845 | B2 | 5/2013 | Ning et al. |
| 8,685,847 | B2 | 4/2014 | Majumdar et al. |
| 2006/0166414 | A1* | 7/2006 | Carlson ............ H01L 21/02381 438/149 |
| 2007/0287259 | A1 | 12/2007 | Kavalieros et al. |
| 2012/0091506 | A1 | 4/2012 | Rim et al. |
| 2012/0261754 | A1 | 10/2012 | Cheng et al. |

OTHER PUBLICATIONS

S. Eguchi et al., "Comparison of arsenic and phosphorus diffusion behavior in silicon-germanium alloys," Applied Physics Letters, vol. 80, No. 10, 2002, pp. 1743-1745.

X.-D. Wang et al., "Two-dimensional ultrashallow junction characterization of metal-oxide-semiconductor field effect transistors with strained silicon," Journal of Vacuum Science & Technology B, vol. 22, No. 1, 2004, pp. 373-376.

* cited by examiner

ABRUPT SOURCE/DRAIN JUNCTION FORMATION USING A DIFFUSION FACILITATION LAYER

DOMESTIC PRIORITY

This application is a divisional application of U.S. patent application Ser. No. 14/221,482, filed Mar. 21, 2014, the disclosure of which is incorporated by reference herein in its entirety.

BACKGROUND

The present invention relates generally to semiconductor device manufacturing techniques and, more particularly, to forming abrupt source/drain junctions using a diffusion facilitation layer.

In the manufacture of integrated circuit devices it is desirable to reduce the dimensions of the transistors used to form the individual circuits. In the case of field effect transistors (FETs), reducing the channel length provides the capability to deliver a given amount of drive current with a smaller channel width. By reducing the width and length of a FET, the parasitic gate capacitance (which is a function of the area defined by the width and length) can be reduced, thereby improving circuit performance. Similarly, reducing the size of transistors is beneficial in that less area is consumed for a given circuit, and this allows more circuits in a given area, or a smaller, less costly chip, or both.

However, FETs cannot simply be scaled down linearly since, as the width and length attributes of a FET are reduced, other parts of the transistor (e.g., the gate dielectric and the junctions) must also be scaled so as to achieve the desired electrical characteristics. Undesirable electrical characteristics in FETs due to improper scaling include coupling of the electric field into the channel region and increased subthreshold conduction. These effects are sometimes referred to as short channel effects.

A number of methods have been developed to form ever more shallow source/drain junctions for FETs in order to achieve proper scaling. Unfortunately, these very shallow junctions create source/drain extensions that have increased resistivity as compared with deeper source/drain junctions. In longer channel length FETs with deeper source/drain junctions, the source/drain extension resistivity is negligible compared to the on-resistance of the MOSFET itself. However, as MOSFET channel lengths decrease into the deep sub-micron region, the increased source/drain extension resistivity becomes a significant performance limitation.

Source/drain junctions formed by ion implantation have ion distribution patterns or profiles in the substrate that are determined by the ion implantation parameters and the substrate properties. Such ion distributions have a finite (i.e., limited) sharpness or abruptness at their edges. The abruptness is then dulled as the dopant undergoes thermal annealing to make it electrically active in the substrate. Such limited abruptness of the dopant profile, and in particular the limited abruptness of the active portion of the dopant profile, poses limitations on the scalability of such devices to very small sizes.

Various methods have been proposed to sharpen the activated dopant profile at the source and drain junctions. These include solid-phase epitaxial regrowth of a pre-amorphized part of the doped area, as well as shallow and rapid melting of that area by lasers. In both cases, achieved active dopant profiles at the junction can become sharper than the profiles as originally implanted. However, these are complex processes with inherent limitations, and have not fully met the need for better and improved solutions.

SUMMARY

In an exemplary embodiment, a method of forming a field effect transistor (FET) device includes forming a diffusion facilitation layer on top of a semiconductor substrate; forming a doped, raised source/drain (RSD) layer on the diffusion facilitation layer; removing a portion of the diffusion facilitation layer, corresponding to a region directly above a channel region of the FET device; and performing an anneal so as to define abrupt source and drain junctions in the semiconductor substrate, wherein dopant atoms from the doped RSD layer diffuse within the diffusion facilitation layer at a faster rate than with respect to the semiconductor substrate.

In another embodiment, a method of forming a field effect transistor (FET) device includes forming a diffusion facilitation layer on top of a semiconductor substrate; forming a dummy gate structure on the diffusion facilitation layer; forming sidewall spacers adjacent the dummy gate structure forming a doped, raised source/drain (RSD) layer on the diffusion facilitation layer, adjacent the sidewall spacers; forming an interlevel dielectric (ILD layer) over the diffusion facilitation layer; removing the dummy gate structure to expose a portion of the diffusion facilitation layer, corresponding to a region directly above a channel region of the FET device; removing the exposed portion of the diffusion layer; performing an anneal so as to define abrupt source and drain junctions in the semiconductor substrate, wherein dopant atoms from the doped RSD layer diffuse within the diffusion facilitation layer at a faster rate than with respect to the semiconductor substrate; and forming a replacement gate structure over the channel region.

In another embodiment, a field effect transistor (FET) device includes a diffusion facilitation layer formed on top of a semiconductor substrate; a doped, raised source/drain (RSD) layer formed on the diffusion facilitation layer; the diffusion facilitation layer having a portion thereof removed, corresponding to a region directly above a channel region of the FET device; and abrupt source and drain junctions defined in the semiconductor substrate, wherein the diffusion facilitation layer and the semiconductor substrate comprise materials such that dopant atoms from the doped RSD layer diffuse within the diffusion facilitation layer at a faster rate than with respect to the semiconductor substrate.

BRIEF DESCRIPTION OF THE DRAWINGS

Referring to the exemplary drawings wherein like elements are numbered alike in the several Figures:

FIGS. 1 through 11 are a series of cross sectional views illustrating a method of forming abrupt source/drain junctions using a diffusion facilitation layer, in which:

FIG. 1 illustrates the formation of a diffusion facilitating semiconductor layer on a semiconductor substrate;

FIG. 2 illustrates the formation of a dummy gate structure on the diffusion facilitating semiconductor layer of FIG. 1;

FIG. 3 illustrates the formation of a doped, raised source/drain layer over the structure of FIG. 2;

FIG. 4 illustrates the formation of an interlevel dielectric layer over the structure of FIG. 3, followed by removal of the dummy gate structure;

FIG. 5 illustrates the removal of a portion of the diffusion facilitating semiconductor layer, corresponding to a location directly above a channel region of the semiconductor substrate;

FIG. 6 illustrates a dopant diffusion process for the structure of FIG. 5, resulting in the formation of abrupt junctions;

FIG. 7 illustrates the formation of a replacement metal gate structure in accordance with further processing;

FIG. 8 is a graph illustrating the increase in diffusivity for arsenic and phosphorous dopant materials in SiGe versus Si;

FIG. 9 is a cross sectional view of an CMOS structure incorporating a diffusion facilitating semiconductor layer for the NFET;

FIG. 10 is a cross sectional view of another CMOS structure incorporating a diffusion facilitating semiconductor layer for the NFET; and FIG. 11 is a cross sectional view of still another CMOS structure incorporating a diffusion facilitating semiconductor layer for both the NFET and the PFET.

DETAILED DESCRIPTION

Disclosed herein is a method of forming an FET device having abrupt source/drain junctions. As explained in further detail below, a diffusion facilitation layer is formed on top of a semiconductor substrate (i.e., channel semiconductor material). Dopant diffusion is postponed until a dummy gate structure is removed and a portion of the diffusion facilitating material is removed from directly above the channel region of the FET. This allows dopant atoms to diffuse relatively quickly through the diffusion facilitating material (present over source/drain regions of the device), but relatively slowly in the channel semiconductor material. As a result, abrupt source/drain junctions are formed, after which processing may continue as known in the art.

Referring generally now to FIGS. 1 through 7, there are shown a series of cross sectional views illustrating a method of forming abrupt source/drain junctions for an FET device using a diffusion facilitation layer, in accordance with an exemplary embodiment.

Figure 1:
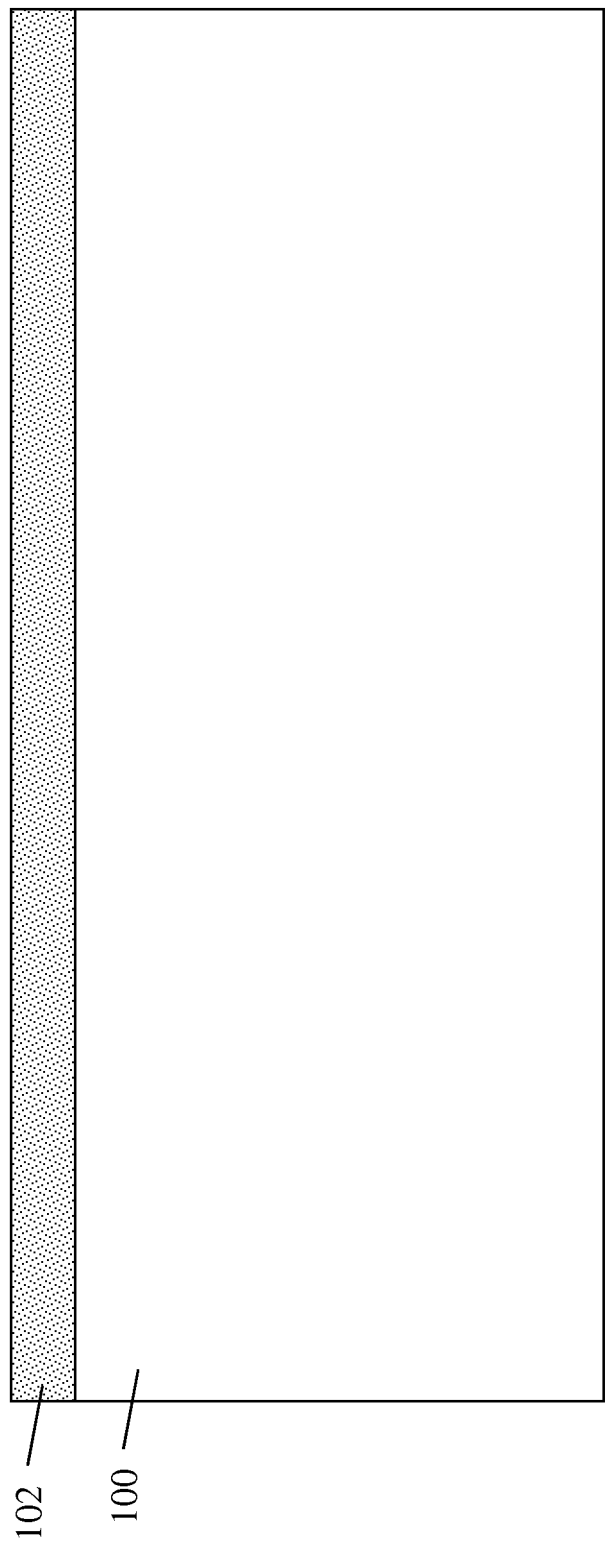

As shown in FIG. 1, a semiconductor substrate 100 has a diffusion facilitation layer 102 formed thereon. The semiconductor substrate 100 may represent, for example, a bulk semiconductor layer or, alternatively, an active semiconductor-on-insulator (SOI) layer formed over a buried insulator (e.g., oxide) (BOX) layer (not shown) formed on a bulk semiconductor layer (not shown), and an active SOI layer formed on the BOX layer 104. In any case, the semiconductor substrate 100 includes a semiconductor material from which an FET device channel is to be defined.

As described herein, a "diffusion facilitation layer" is a semiconductor layer in which the diffusivity of a given dopant material is faster within the diffusion facilitation layer than with respect to the underlying semiconductor substrate (i.e., the semiconductor material in which the FET channel region is to be defined). In the case of an NFET device, the semiconductor substrate 100 may be silicon (Si) for example, and the diffusion facilitation layer 102 may be silicon germanium (SiGe) for example. Conversely, in the case of a PFET device, the semiconductor substrate 100 may be SiGe for example, and the diffusion facilitation layer 102 may be Si for example. In an exemplary embodiment, the diffusion facilitation layer 102 may be epitaxially grown on the semiconductor substrate 100, to a thickness of about 3 to about 25 nanometers (nm), and more specifically to about 10 nm.

Figure 2:
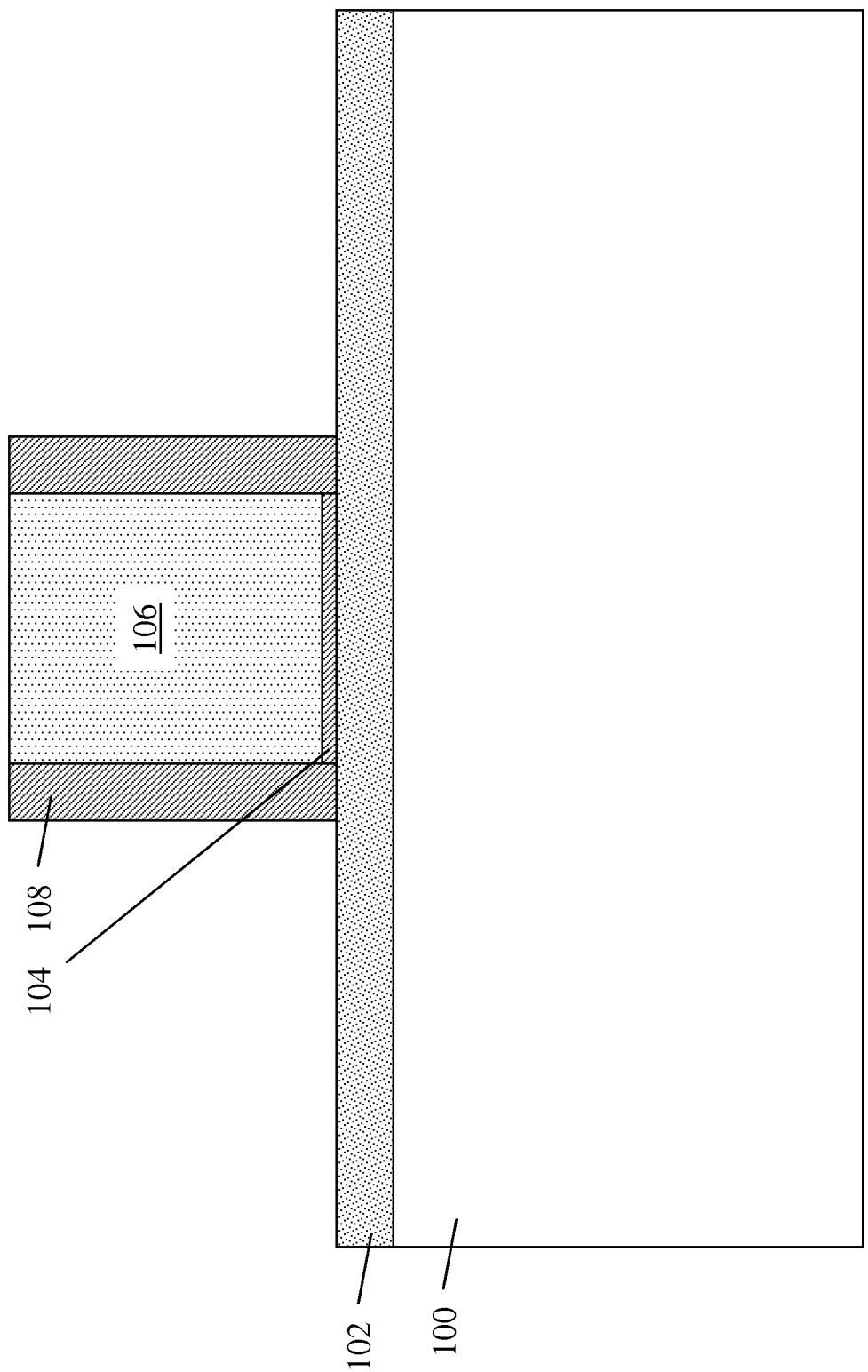

In FIG. 2, a dummy gate structure is formed on the diffusion facilitating semiconductor layer 102. The dummy gate structure may include, for example, a dummy gate dielectric layer 104 (e.g., oxide, nitride, high-k layer, etc.) and dummy gate electrode layer 106 (e.g., polysilicon), which are deposited and patterned as known in the art. Sidewall spacers 108 (e.g., a nitride material) are also shown formed on sidewalls of the dummy gate structure in FIG. 2.

Figure 3:
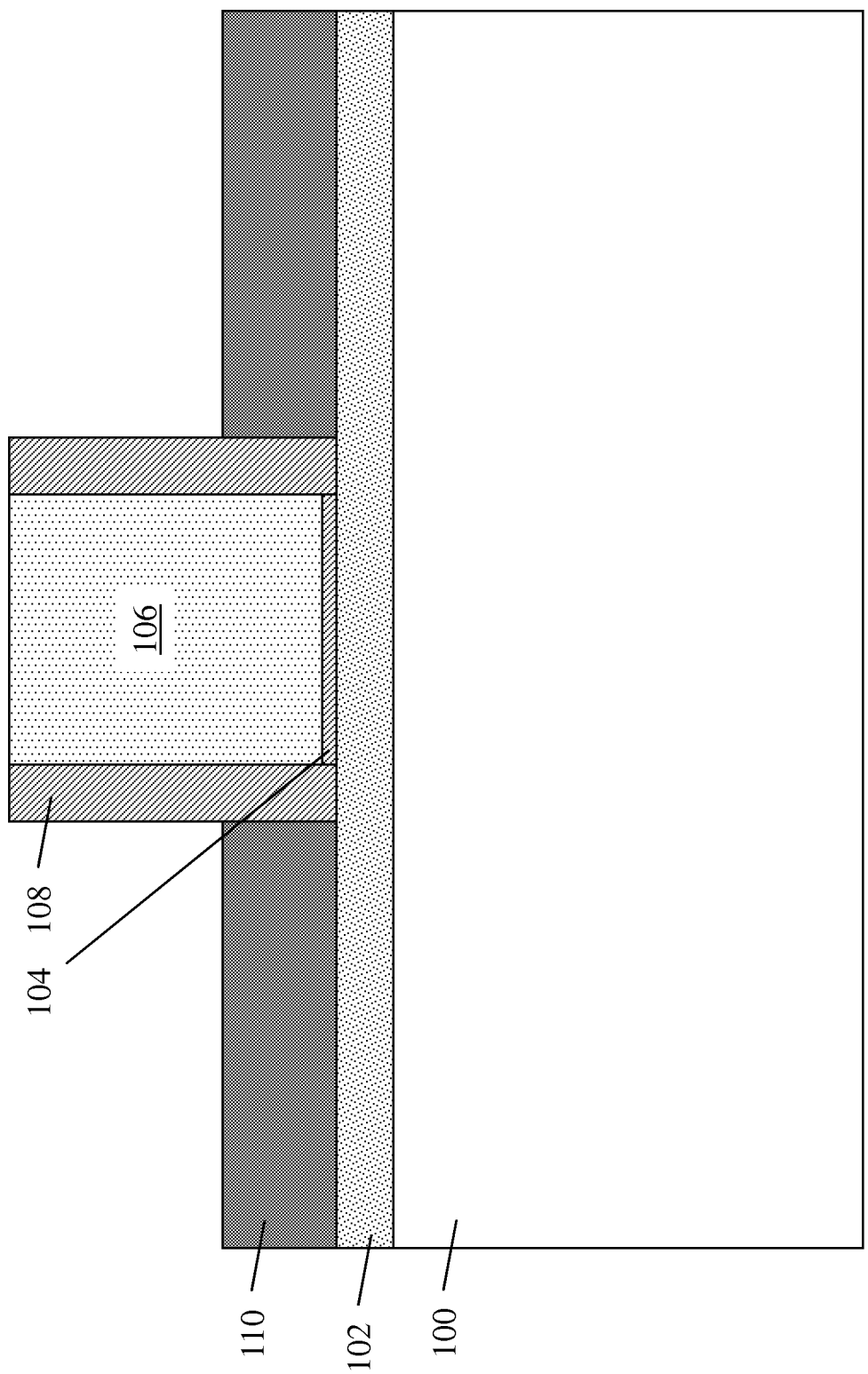
Figure 4:
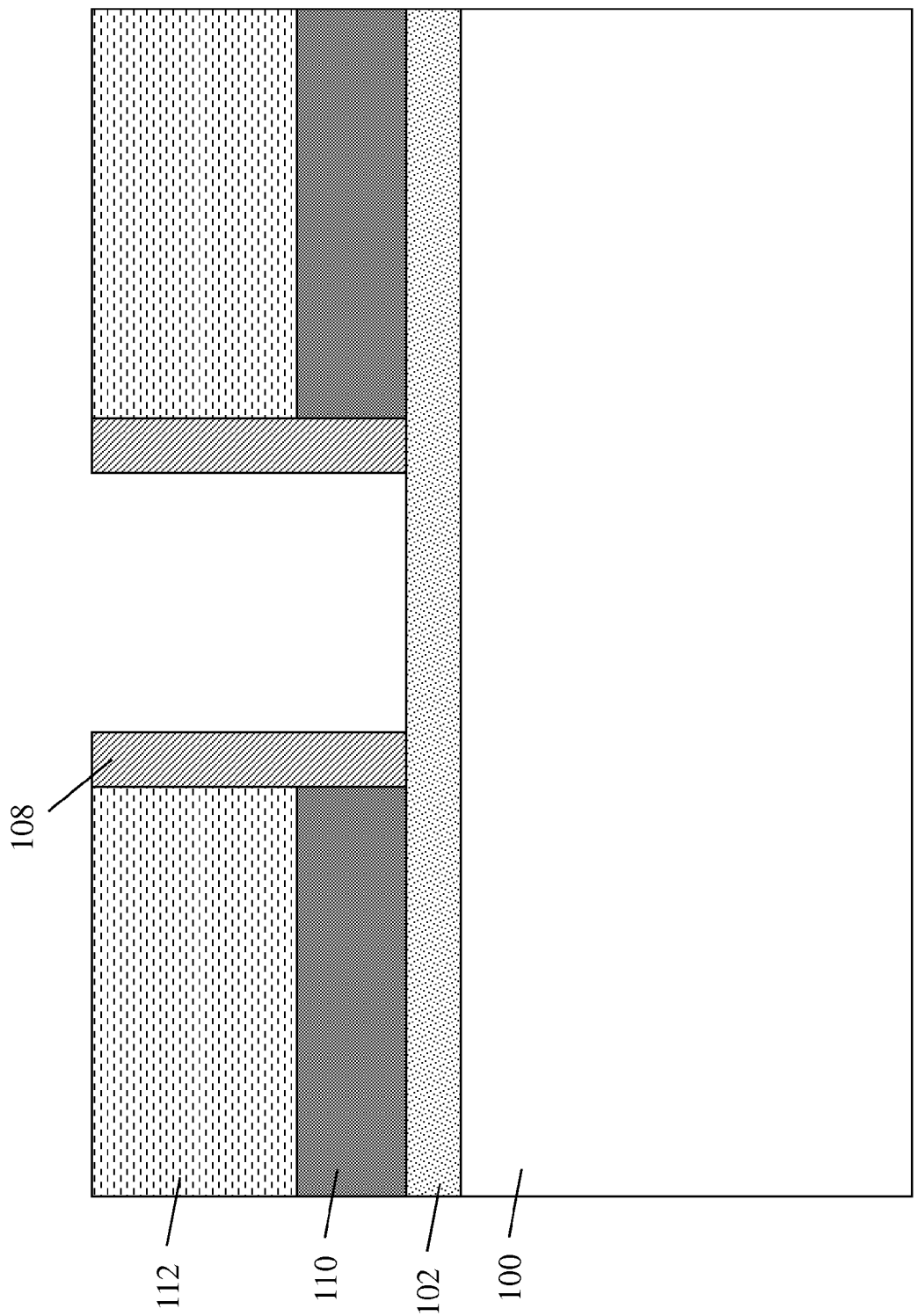
Figure 5:
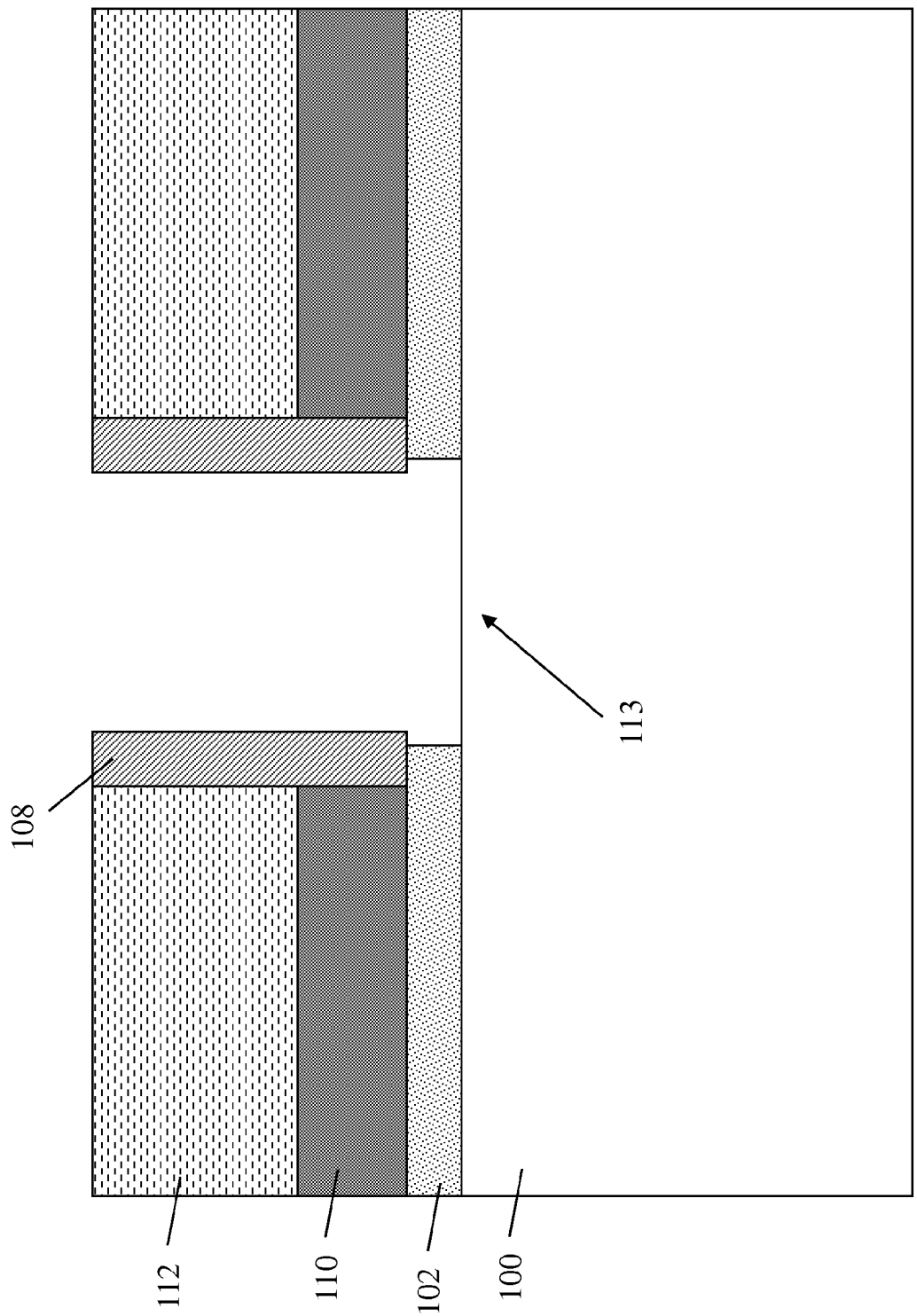

As then shown in FIG. 3, a doped, raised source/drain (RSD) layer 110 is formed over the diffusion facilitating semiconductor layer 102. The doped RSD layer 110 may be formed, for example, by layer deposition and ion implantation. In the case of an NFET device, the doped RSD layer 110 may utilize arsenic (As) or phosphorous (P) as the dopant material, and in the case of a PFET device, the doped RSD layer may utilize boron (B) as the dopant material. In addition, the doped RSD layer 110 may alternatively be formed by in-situ doping or as an in-situ doped, embedded layer. In any case, the doped RSD layer 110 is not yet subjected to a diffusion anneal at this point in the process. Instead, an interlevel dielectric (ILD) layer 112 is formed over the structure, as illustrated in FIG. 4. The ILD layer 112 may be formed, for example, from an insulating material such as an oxide, a nitride, an oxynitride or a porous low-k material. One deposited, the ILD layer 112 is planarized such as by chemical mechanical polishing (CMP).

As additionally shown in FIG. 4, the dummy gate structure is then removed, such as by an etching process. In the event similar materials are used for the dummy gate electrode and the ILD layer 112, it is conceivable that some thickness of the ILD layer 112 may be reduced during the dummy gate structure removal. Then, in FIG. 5, the portion of the diffusion facilitating semiconductor layer 102 exposed by the dummy gate structure removal is then also removed, so as to expose the semiconductor substrate 100. Again, the portion of the diffusion facilitating semiconductor layer 102 removed corresponds to the location of a channel region 113 that is subsequently defined in the semiconductor substrate. As will be noted from FIG. 5, the removal of the exposed diffusion facilitating semiconductor layer 102 may result in a slight undercutting below the sidewall spacers 108.

Figure 6:
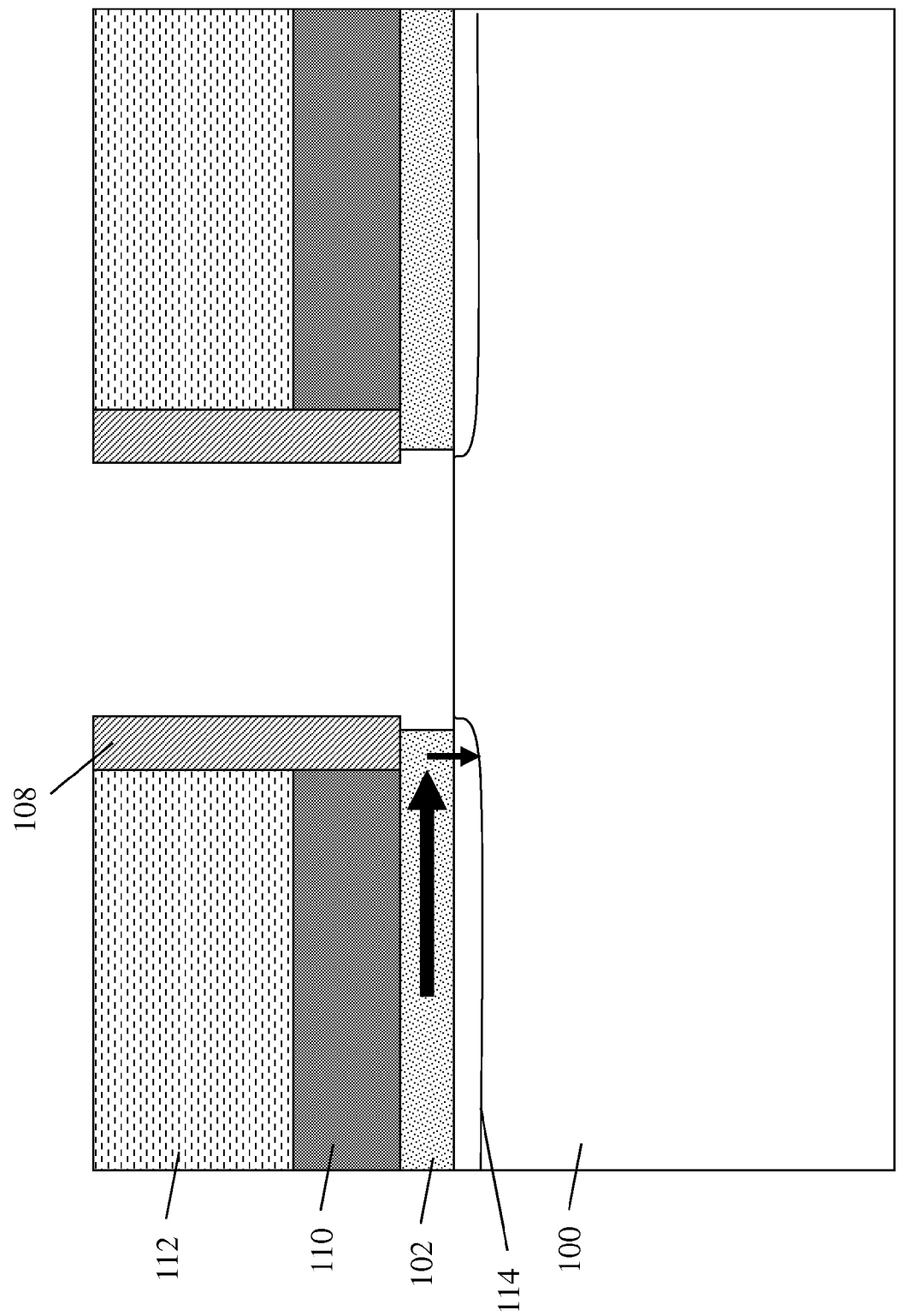

Referring now to FIG. 6, a diffusion anneal is performed so as to define sharp source and drain junctions 114 in the semiconductor substrate 100. The large horizontal arrow in FIG. 6 represents faster diffusion of the dopant atoms within the diffusion facilitating semiconductor layer 102, while the small vertical arrow represents slower diffusion of the dopant atoms within the semiconductor substrate 100 (i.e., the channel material). As a result, the source and drain junctions 114 have a sharply tailored profile, extending (for example) about 3-5 nm below the top surface of the semiconductor substrate 100.

Figure 7:
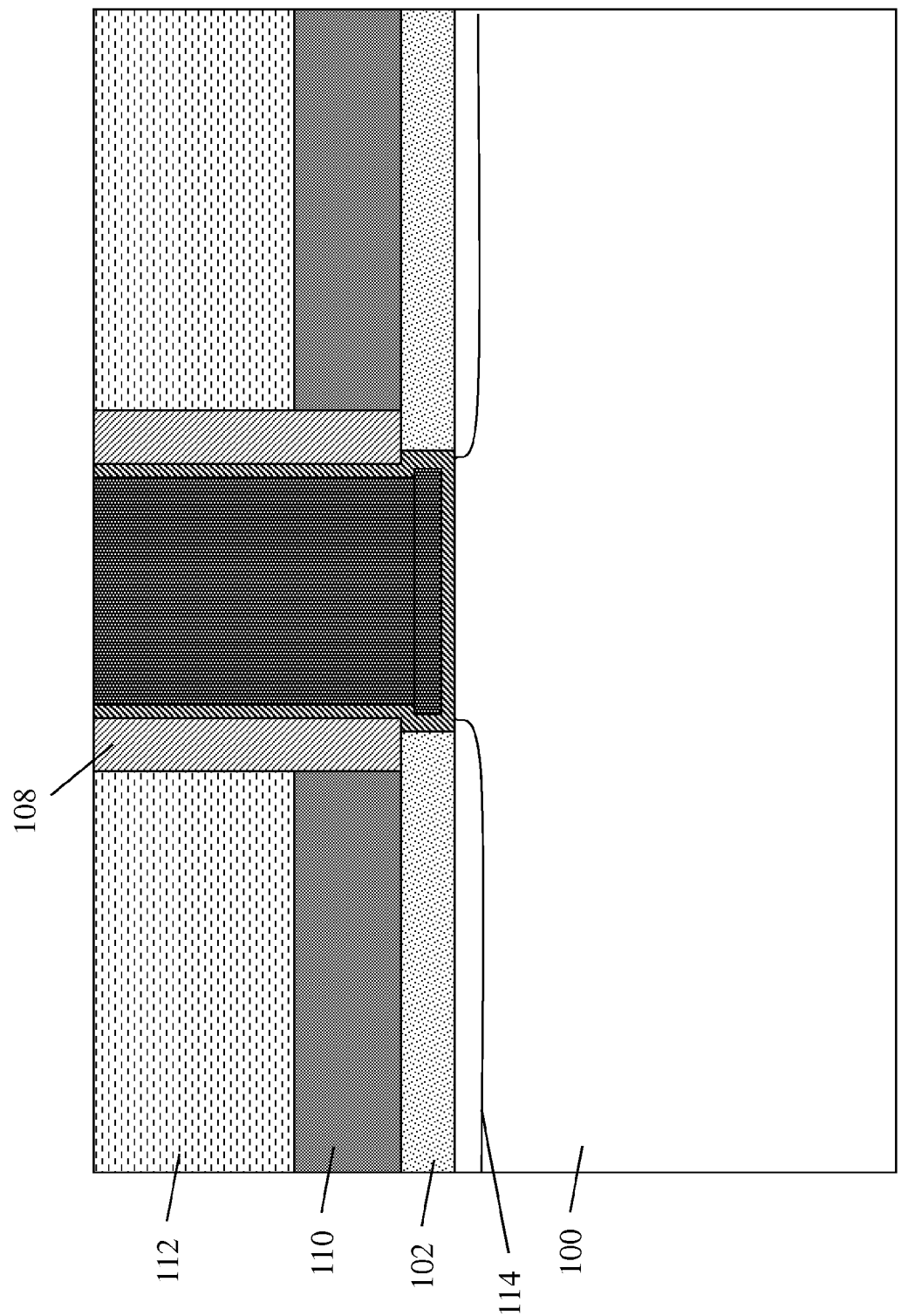

Once the sharp source and drain junctions 114 are defined by the anneal, processing as known in the art may continue. For example, FIG. 7 illustrates the formation of a replacement metal gate (RMG) structure in which one or more high-k dielectric layers 116 are formed over the structure, followed by one or more metal gate layers 118. The RMG layers are then planarized to the level of the ILD layer 112. Additional processing as known in the art may then continue (e.g., gate, source, drain contact formation, wiring layers, etc.)

It should be appreciated at this point that the above described technique may be employed with any type of semiconductor device structure as known in the art including, but not limited to, bulk substrates, partially depleted SOI (PDSOI) substrates, fully depleted SOI (FDSOI) substrates, SOI FinFET devices, bulk FinFET devices, nanowires, etc.

Figure 8:
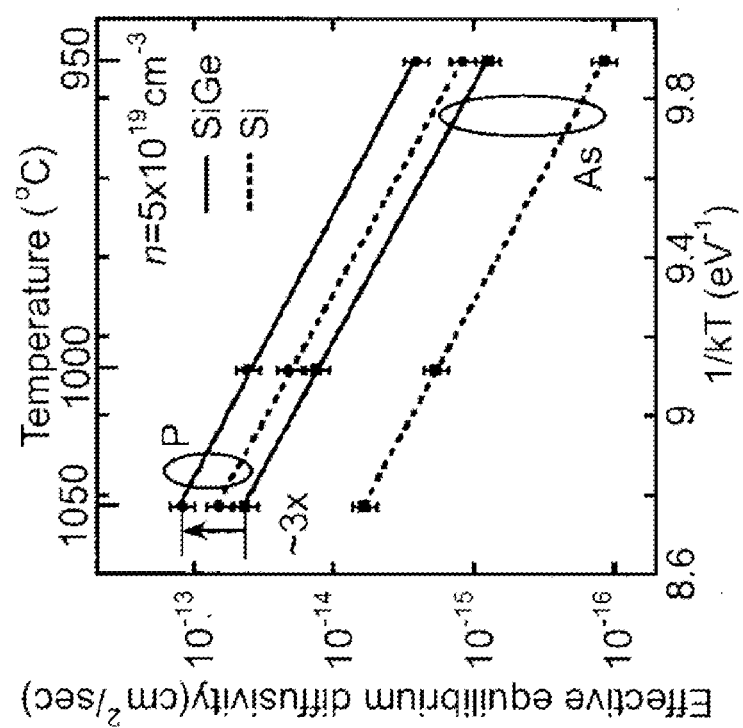

With respect to the difference in diffusion rates for certain semiconductor layers, FIG. 8 is a graph illustrating the effective equilibrium diffusivity (cm²/sec) as a function of temperature for As and P dopants in a diffusion facilitating layer (SiGe) versus a silicon substrate. In the case of phosphorous, there is roughly a twofold increase in the diffusivity of P atoms in SiGe than in Si. Also, in the case of arsenic, there is roughly a threefold increase in the diffusivity of P atoms in SiGe than in Si. Again, the graph illustrates a practical example of using an SiGe diffusion facilitating layer for a silicon substrate in the case of an NFET device using P and/or As dopant atoms. Where the technique is applied for a PFET device, a SiGe substrate (channel material) may be used in conjunction with as silicon diffusion facilitating layer for boron (B) dopant atoms.

In terms of CMOS integration, different possibilities are contemplated. For example, for a homogeneous substrate (e.g., Si or SiGe), the diffusion facilitating layer technique for forming sharp source/drain junctions would be applicable for either the NFET devices or for the PFET devices. That is, for example, for an Si substrate, the technique would be applicable to forming NFET devices, whereas for a SiGe substrate, the technique would be applicable to forming PFET devices.

Continuing with the NFET example as described above, FIG. 9 is a cross sectional view of a CMOS structure having an NFET device 900 and a PFET device 901, which incorporates a diffusion facilitating semiconductor layer for the NFET device 900. The NFET device 900 includes the layers in the embodiment discussed above, such as the silicon substrate 100, the SiGe diffusion facilitating semiconductor layer 102, and the As or P doped RSD layer 110. It will be noted that for purposes of simplicity, certain features that would also be present in the CMOS structure are not specifically illustrated, such as an ILD layer and a shallow trench isolation to electrically insulate the NFET device 900 from the PFET device 901.

Figure 9:
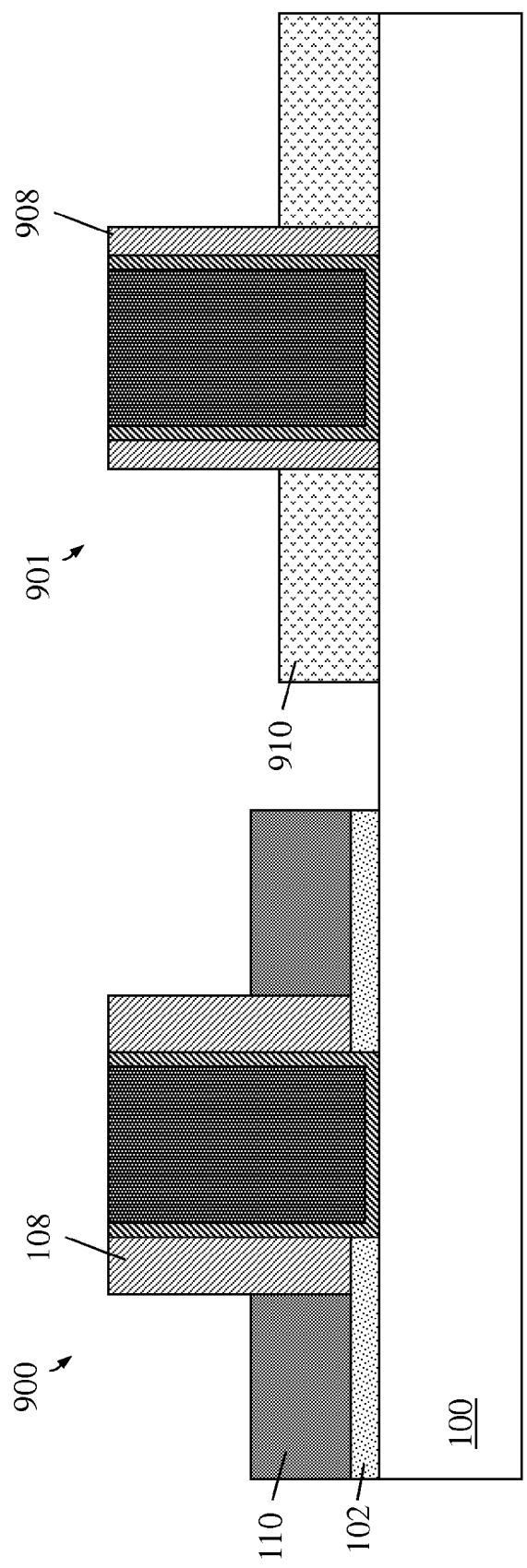
Figure 10:
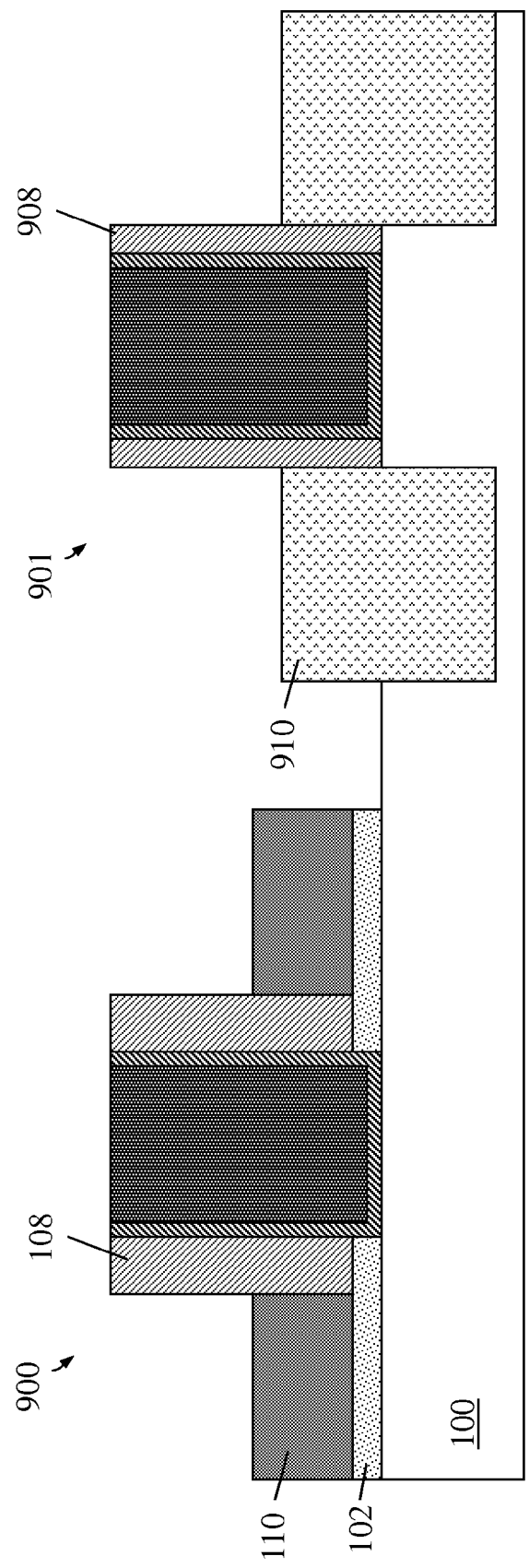

By way of comparison, the PFET device 901 in FIG. 9 does not benefit from a SiGe diffusion facilitating semiconductor layer over a silicon substrate. Thus, the PFET device 902 features a B doped RSD layer 910 formed on the substrate 100. Also of note are the thinner spacers 908 used for the PFET device 901, in comparison to the wider spacers 108 for the NFET device 900. In the embodiment shown, the PFET device 901 is formed prior to the NFET device 900. A slight variation on this structure is illustrated in the embodiment of FIG. 10. Here, the PFET device 901 features an embedded RSD layer 910.

Figure 11:
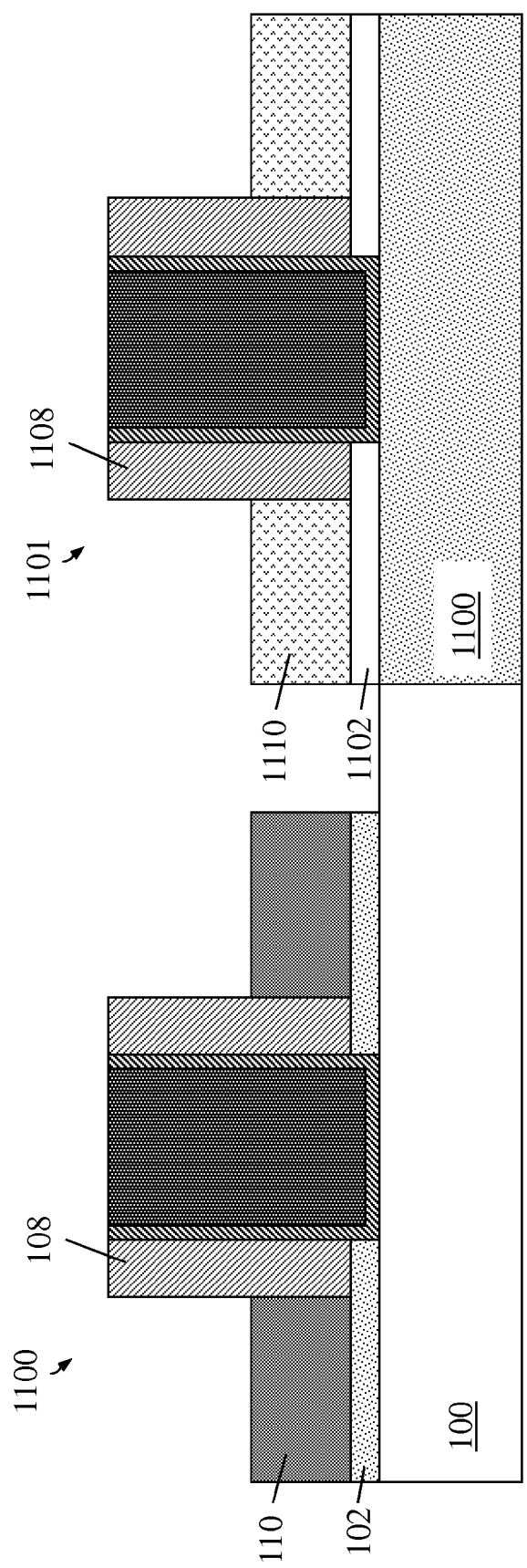

Finally, FIG. 11 is a cross sectional view of another CMOS structure that incorporates a diffusion facilitating semiconductor layer for both the NFET device 1100 and the PFET device 1101. As will be noted, the CMOS structure incorporates a hybrid type substrate, in that the channel material (substrate) 100 for the NFET device 1100 is silicon, whereas the channel material (substrate) 1100 for the PFET device 1101 is SiGe. In this case, the PFET device 1101 includes a silicon diffusion facilitating layer 1102 formed on the SiGe substrate 1100, and a B doped RSD layer 1110 formed on the silicon diffusion facilitating layer 1102. The formation of sharp source/drain junctions in the PFET device 1101 is similar in principle to that of the NFET device 1100. During a diffusion anneal, dopant B atoms diffuse more rapidly within the Si diffusion facilitating layer 1102 then they do in the SiGe substrate 1100, leading to the sharp junction profile.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A field effect transistor (FET) device, comprising:
   a diffusion facilitation layer comprising silicon germanium formed on top of a silicon semiconductor substrate;
   a doped, raised source/drain (RSD) layer formed on the diffusion facilitation layer, wherein the RSD layer is doped with one or more of arsenic and phosphorous;
   the diffusion facilitation layer having a portion thereof removed, corresponding to a region directly above a channel region of the FET device; and
   abrupt source and drain junctions defined in the semiconductor substrate, wherein the diffusion facilitation layer and the semiconductor substrate comprise materials such that dopant atoms from the doped RSD layer diffuse within the diffusion facilitation layer at a faster rate than with respect to the semiconductor substrate.

2. The device of claim 1, wherein the diffusion facilitation layer is epitaxially grown on the semiconductor substrate.

3. The device of claim 2, wherein the diffusion facilitation layer has a thickness of about 3 to about 25 nanometers (nm).

4. The device of claim 3, wherein the source and drain junctions extend about 3-5 nm below a top surface of the semiconductor substrate.

5. A field effect transistor (FET) device, comprising:
   a diffusion facilitation layer comprising silicon formed on top of a silicon germanium semiconductor substrate;
   a doped, raised source/drain (RSD) layer formed on the diffusion facilitation layer, wherein the RSD layer is doped with boron;
   the diffusion facilitation layer having a portion thereof removed, corresponding to a region directly above a channel region of the FET device; and
   abrupt source and drain junctions defined in the semiconductor substrate, wherein the diffusion facilitation layer and the semiconductor substrate comprise materials such that dopant atoms from the doped RSD layer diffuse within the diffusion facilitation layer at a faster rate than with respect to the semiconductor substrate.

6. The device of claim 5, wherein the diffusion facilitation layer is epitaxially grown on the semiconductor substrate.

7. The device of claim 6, wherein the diffusion facilitation layer has a thickness of about 3 to about 25 nanometers (nm).

8. The device of claim 7, wherein the source and drain junctions extend about 3-5 nm below a top surface of the semiconductor substrate.

* * * * *